US009047981B2

(12) United States Patent
Hegde et al.

(10) Patent No.: US 9,047,981 B2
(45) Date of Patent: Jun. 2, 2015

(54) BIT-FLIPPING IN MEMORIES

(71) Applicants: Arun B. Hegde, Acton, MA (US); Spencer M. Gold, Pepperell, MA (US); Thomas E. Ryan, Boylston, MA (US)

(72) Inventors: Arun B. Hegde, Acton, MA (US); Spencer M. Gold, Pepperell, MA (US); Thomas E. Ryan, Boylston, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 67 days.

(21) Appl. No.: 13/724,924

(22) Filed: Dec. 21, 2012

(65) Prior Publication Data

US 2014/0177323 A1 Jun. 26, 2014

(51) Int. Cl.
*G11C 7/04* (2006.01)
*G11C 11/419* (2006.01)

(52) U.S. Cl.
CPC .................................... *G11C 11/419* (2013.01)

(58) Field of Classification Search
CPC .......................................................... G11C 7/04
USPC .......................................................... 365/154
See application file for complete search history.

(56) References Cited

U.S. PATENT DOCUMENTS 5,630,106 A 5/1997 Ishibashi
7,310,281 B1 * 12/2007 Hsueh et al. .................. 365/222
2005/0134360 A1 * 6/2005 Aipperspach et al. ........ 327/513
2009/0091968 A1 4/2009 Dietrich et al.
2009/0094497 A1 4/2009 Parris et al.
2010/0246297 A1 * 9/2010 Zhang et al. .................. 365/200
2011/0051530 A1 * 3/2011 Kushida .................. 365/189.05
2012/0274353 A1 11/2012 Pedersen et al.

OTHER PUBLICATIONS

International Search Report and Written Opinion dated Apr. 16, 2014 for Application No. PCT/US2013/076968, 10 pages.

* cited by examiner

*Primary Examiner* — Huan Hoang
*Assistant Examiner* — Min Huang
(74) *Attorney, Agent, or Firm* — Abel Law Group, LLP

(57) ABSTRACT

Data stored in SRAM cells are periodically flipped e.g., before long idle periods. Operating the memories in both a ‘flipped’ mode and a ‘non-flipped’ mode helps cause the Bias Temperature Instability (BTI) degradation to be symmetric, thereby not degrading the Static Noise Margin (SNM) degradation of the cells. The data stored in memory locations is flipped by reading out the data, inverting the read out data, and writing the inverted read out data into the memory locations until the memory locations of the SRAM have been read out and written. When the memory operates in flipped mode, data read from and written into the memory is inverted to maintain transparency to the memory user. After operating the data in flipped mode for a period of time, the flipped data stored in the memory is reflipped to operate in the non-flipped mode.

18 Claims, 4 Drawing Sheets

BIT-FLIPPING IN MEMORIES

BACKGROUND

1. Field

This disclosure relates to memories and more particularly to mitigating issues that can arise with SRAMs.

2. Description of the Related Art

Static random access memory (SRAM) retains its state as long the circuit remains powered. FIG. 1 illustrates a conventional six transistor SRAM cell 100 in which four transistors 101, 103, 105, and 107, forming two cross-coupled inverters, store the cell value. Negative Bias Temperature Instability (NBTI) as well as Positive Bias Temperature Instability (PBTI) effects results in threshold voltage (Vth) shifts of static random access memory (SRAM) cells when the device is placed under stress. The Bias Temperature Instability (BTI) effects increase the effective threshold voltages of both the n-channel field effect transistors (NFET) and p-channel field effect transistors (PFET) devices in the SRAM cells and makes them 'weaker'. If the same data is held by the SRAM cell for prolonged periods of time, the threshold voltage of different FETs within the SRAM cell gets affected differently causing asymmetrical behavior of the cross coupled inverters and thereby a degradation of both Static Noise Margin (SNM) as well as cell read currents. The SNM degradation especially causes the low-voltage operations of SRAMs to suffer. FIG. 1 shows the effects of BTI on different transistors within an SRAM cell. NTBI affects PMOS transistors 101 and 105. PBTI stress affects NMOS transistors 103, 107, 109, and 111.

SUMMARY OF EMBODIMENTS

In one embodiment an apparatus includes a memory, a first selector circuit to select between inverted read data and non-inverted read data, and a second selector circuit to select between non-inverted write data, inverted write data, and the inverted read data, and supply the selected data to the memory.

In another embodiment a method includes flipping data stored in memory locations by reading out the data, inverting the read out data, and writing the inverted read out data into the memory locations until a predetermined number of memory locations have been read out and written.

In another embodiment, a non-transitory computer-readable medium stores a computer readable data structure encoding a functional description of an integrated circuit. The integrated circuit includes a static random access memory and a first selector circuit to select between inverted read data and non-inverted read data. A second selector circuit selects between non-inverted write data, inverted write data, and the inverted read data, and supplies the selected data to the memory. A first inverter circuit is coupled to receive read data from the memory and supply the first and second selector circuits with the inverted read data. A second inverter circuit is coupled to receive the write data and supply inverted write data to the second selector circuit.

BRIEF DESCRIPTION OF THE DRAWINGS

The embodiments described herein may be better understood, by referencing the accompanying drawings.

The use of the same reference symbols in different drawings indicates similar or identical items.

DETAILED DESCRIPTION

Embodiments described herein address the problem of mitigating the Static Noise Margin (SNM) degradation of SRAM bitcells within memories due to the bitcells holding constant values for long time periods. A significant cause of this SNM degradation is the BTI effects that occur in MOSFETs. One way to reduce the SNM degradation due to BTI effects is to use 'data flipping' within the SRAM cell arrays. In such an approach, the system periodically flips the data stored in SRAM cells so that the FETs within the cells are subjected to 'symmetric' stress and thereby do not degrade the SNM of the cells over time. It may be necessary to account for the smaller read-currents over time due to BTI degradation by just margining the differential requirements of sense amplifiers used within the memory design and thereby specify that the memories should run at slower speeds right from the start (although they could run at slightly higher frequencies in the beginning) With the reduction in SNM degradation, the memories can be operated at slightly lower voltages than otherwise.

Embodiments flip bits within SRAM to achieve BTI mitigation of SRAM cells. In an embodiment, the SRAM is embedded SRAM used, e.g., in a microprocessor. An embodiment ensures that the cell contents of the memories are flipped, e.g., just prior to long idle periods (and the I/O interface to the memory presents the flipped data) so that for the users of these memories, the data-flip is transparent. Operating the memories in both a 'flipped' mode and a 'non-flipped' mode helps cause the BTI degradation to be symmetric, thereby not degrading the SNM of the cells.

Figure 1:
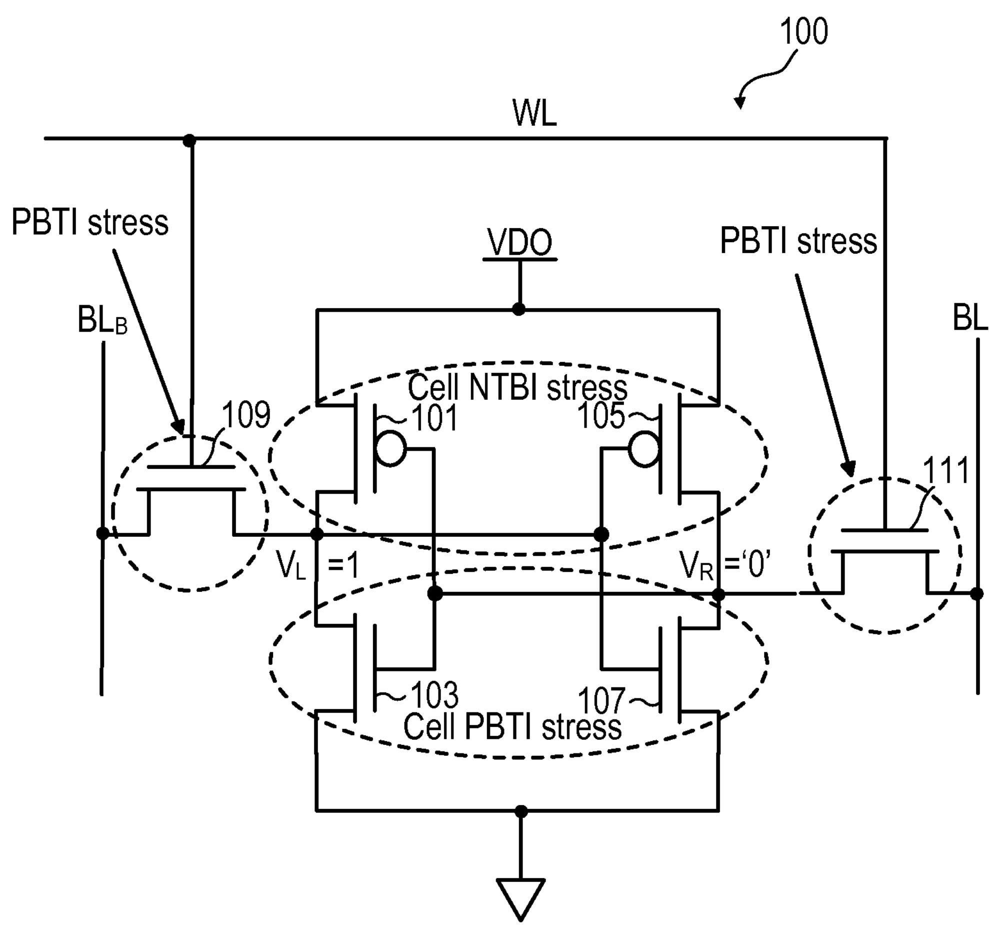
FIG. 1 illustrates a conventional SRAM cell.
Figure 2:
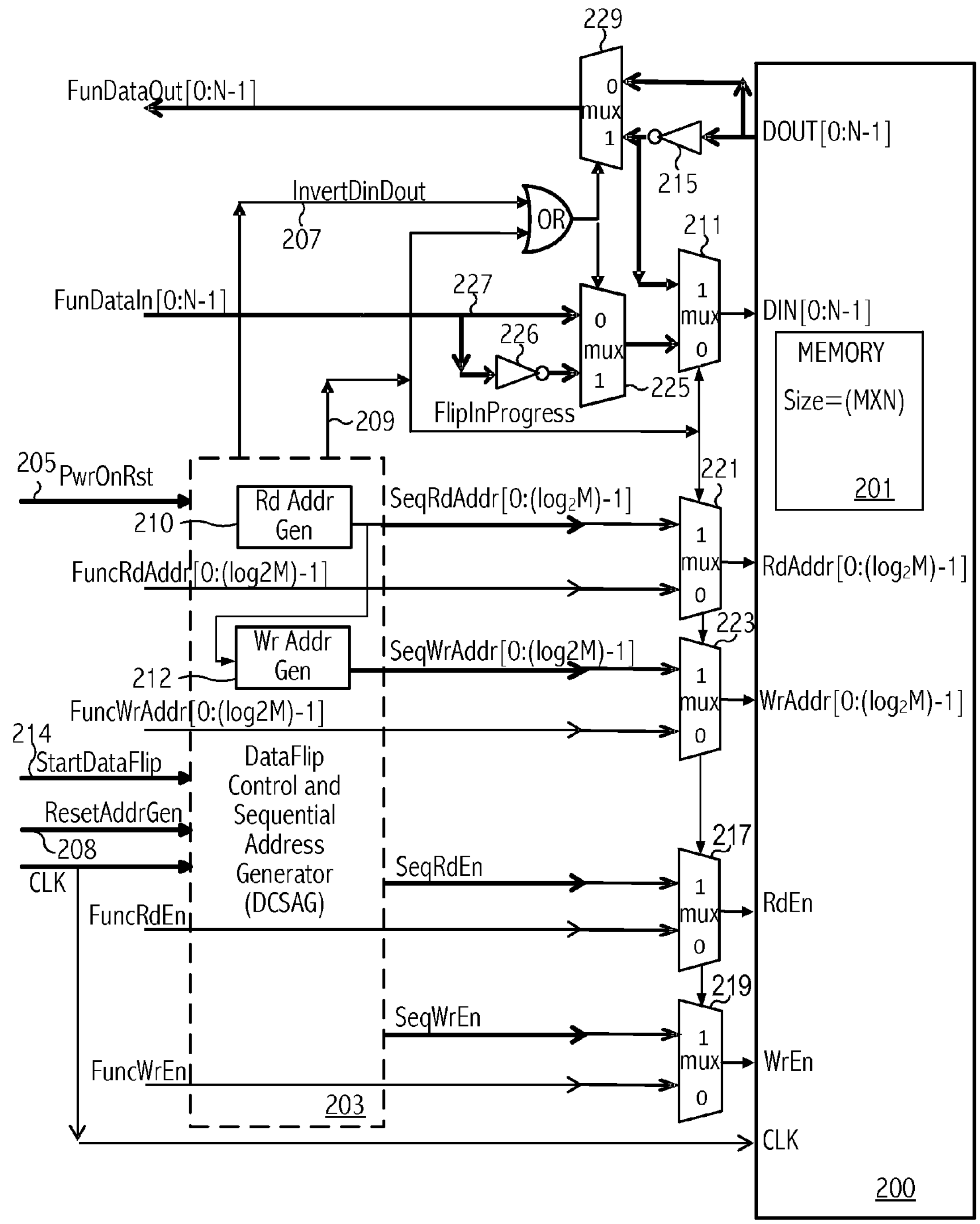
FIG. 2 illustrates an embodiment to flip an SRAM memory.

FIG. 2 illustrates an embodiment that effectuates the bit-flipping of SRAM memory 200. SRAM memory 200 is shown as a generic memory block, which includes SRAM cells 201 and associated peripheral logic to allow reading from and writing to the SRAM cells 201. The memory 200 has a size of M×N with M words each of length N bits. DOUT[0:N−1] is a 'N' bit data being read out of the memory block, DIN[0:N−1] is an 'N' bit data being written into memory block. RdEn is the read-enable signal, which when high allows data to be read-out of the memory block. WrEn is the write-enable signal which permits the data applied to DIN to be written into the memory block. RdAddr is the Read Address bus and WrAddr is the Write Address bus.

Additional logic around the memory block 200 provides the bit-flipper functionality. The additional logic includes selector circuits implemented as multiplexers, which help to steer either the regular functional data, address and read/write enable signals or the corresponding signals from the data flip and Sequential Address Generator (DCSAG) control block 203 used for bit-flipping functionality. In FIG. 2, when the multiplexer select signal is high (1), data corresponding to the input next to '1' is steered to the output of the multiplexer and if the multiplexer select signal is low (0), data corresponding to the input next to '0' is steered to the multiplexer output. The multiplexer select signals are generated by the DCSAG block 203.

After the power-on-reset signal supplied on node 205 goes low, 'InvertDinDout' signal 207, which is generated by the DCSAG block 203, goes low to enable write/read operations of the memory block in the regular non-flipped mode. In an embodiment, when it becomes known that the memory block will not be accessed for a long period of time, the signal ResetAddrGen 208 is asserted for at-least 1 clock cycle. The knowledge about access may be based, e.g., on the system being about to enter a low power state such as a sleep state and thus the memory will typically not be utilized. Asserting ResetAddrGen 208 resets the address generators 210 and 212 (so that they can start counting sequentially, e.g., from address 0 to M−1). After lowering the 'ResetAddrGen' signal 208, the 'StartDataFlip' signal 214 is taken high for at least 1 clock cycle. That initiates the data-flipping of the memories. The StartDataFlip signal and ResetAddrGen signal may be provided from control logic elsewhere in the system, e.g., associated with power state control, operating system software, or some hardware and/or software elsewhere in the system. The FlipinProgress signal 209 is asserted indicating that the process of flipping data of the memories is active. The FlipinProgress signal 209 remains asserted until the entire data-flipping operation of the memory is complete. Once completed, the InvertDinDout signal 207 toggles state (i.e., if it was 0 before, it will go to 1 and vice-versa). InvertDinDout signal 207 indicates whether the data in the memory is flipped and therefore data written to and read from the memory 200 requires inverting. The FlipInProgress signal 209 also goes low after the data-flipping operation is complete.

Asserting the TlipInProgress' signal (taking it high in the illustrated embodiment) causes the inverted DOUT[0:N-1] data to be fed back to the input DIN[0:N-1]. With FlipinProgress high, multiplexer 211 selects the inverted read data supplied by inverter logic 215. The 'SeqRdEn' and 'SeqWrEn' signals are also asserted for the entire duration of the data-flipping operation and are selected by multiplexer 217 and 219 over the functional read and write enables. The sequential read addresses SeqRdAddr generated by the DCSAG block 203 are supplied to the read address port of the memory RdAddr through multiplexer 221. The write address port of the memory receives a delayed (pipelined) version of the sequential read address. That pipelined version of the SeqRdAddr signal is shown as 'SeqWrAddr'. The amount of delay (pipeline) applied is dependent on the requirements of the memory block (and if the memory module itself supports pipelined reads). Thus, while the read address block 210 may be implemented as a counter to sequentially generate the read addresses, the write address block 212 may be implemented as pipeline delay stages appropriate to the memory. Multiplexer 223 selects the SeqWrAddr signals over the functional write address signals (FuncWrAddr) when FlipinProgress is asserted. The sequential address generator 210 within the DCSAG block generates all addresses from 0 to M-1, so that all the M, N-bit data words can be read out, inverted and written back again into the memory.

Every time a 'data-flipping' operation on the entire memory completes, the 'InvertDinDout' signal 207 toggles state. If the data within the memories is inverted with respect to the original state of the data, the 'InvertDinDout' will be asserted. In that case, during regular functional operation, when new data needs to be written into the memory, the data input ('FuncDataIn') needs to be inverted before being written into the memory 200. That is because as long as 'InvertDinDout' high, the system will be reading the inverted version of the data written into the memory block. Thus, multiplexer 225 selects the inverted data from inverter 226 rather than the functional data 227. Multiplexer 211 selects as its input the data from multiplexer 225 because flip-in-progress signal 209 is deasserted.

Similarly, when reading data from the memory when in flipped mode, multiplexer 229 selects the data path from the inverter 215 rather than DOUT directly from the memory so that the inverted data stored in the memory is placed in its non-inverted state.

Once the inverted data is written back and the memory 200 is in the 'flipped' mode with respect to data within the memories, the 'InvertDinDout' signal 207 is kept high although the 'FlipInProgress' signal 209 goes low. During regular functional mode of operation while the memory is flipped, all data written into the memory is inverted and data coming out of the memories is also inverted. That makes the 'data-flip' transparent to the users of memory block 200. If 'InvertDinDout' is low after the data-flip operation is complete, the functional data is not inverted as it is written into or read out of the memory block.

After operating for a period of time with the memory 200 in flipped mode, the memory is flipped back to its original state. The operation is the same as the flipping operation. On assertion of the StartDataFlip signal, for example, just before entering a sleep state, the same operation that was used to flip the data in the memory is used to unflip the data in the memory. That is, the sequential addresses are supplied to the memory, and the data is read out, inverted, and written back. When the flipping operation completes the InvertDinDout signal is deasserted indicating the memory is in regular (non-inverted) rather than flipped mode.

Figure 3:
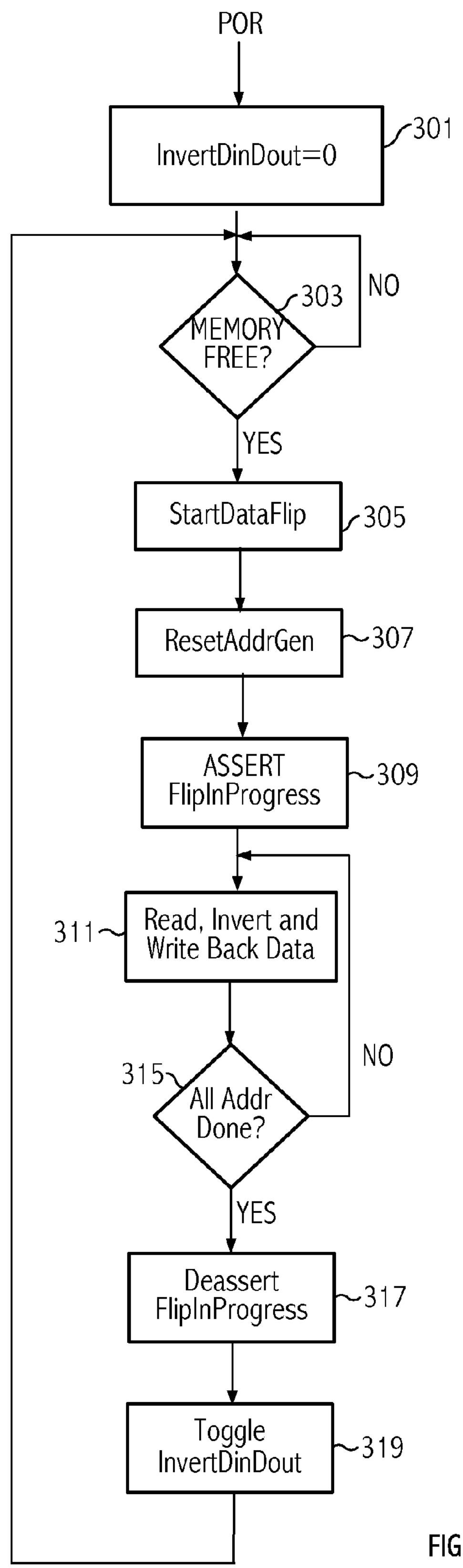
FIG. 3 illustrates a flow diagram of operation of an embodiment.

The control logic in the control block 203 may be implemented in a state machine or other control logic that operates in accordance with the description of the generation of the functionality herein including the various address and control signals herein. FIG. 3 illustrates a flow diagram illustrating one embodiment of a system utilizing the flipping operation.

After a power on reset (POR) the InvertDinDout signal is set to zero in 301 to indicate the memory is an a non-inverted state. In 303, the system waits for the memory to be free for a sufficient time to reset the memory contents. Thus, e.g., the system may be waiting for a period of memory inactivity that may be associated with a sleep or other low power state. When that period of inactivity occurs, the StartDataFlip signal is asserted to trigger the start of the data flipping operation. That signal may be used to cause address generators to reset or the ResetAddrGen signal may be asserted separately as shown in 307. In 309, the FlipInProgress signal is asserted. In 311 the flip operation continues by reading, inverting, and writing back data to the memory until in 315 all addresses have been inverted. After the flipping operation is completed, the FlipInProgress signal is deasserted in 317 and the InvertDatainDout signal is toggled. The system goes back to waiting for the next time period when the memory is available for the flipping operation.

In an embodiment the system, e.g., the operating system or other software and/or hardware in the system, tracks the amount of time (using timers or other counting mechanisms) spent flipped and non-flipped to try and equalize the time spent by the cells flipped and non-flipped, which can help make the SRAM cells more stable. Thus, the StartDataFlip signal can be controlled to try and equalize the time spent flipped and non-flipped.

Figure 4:
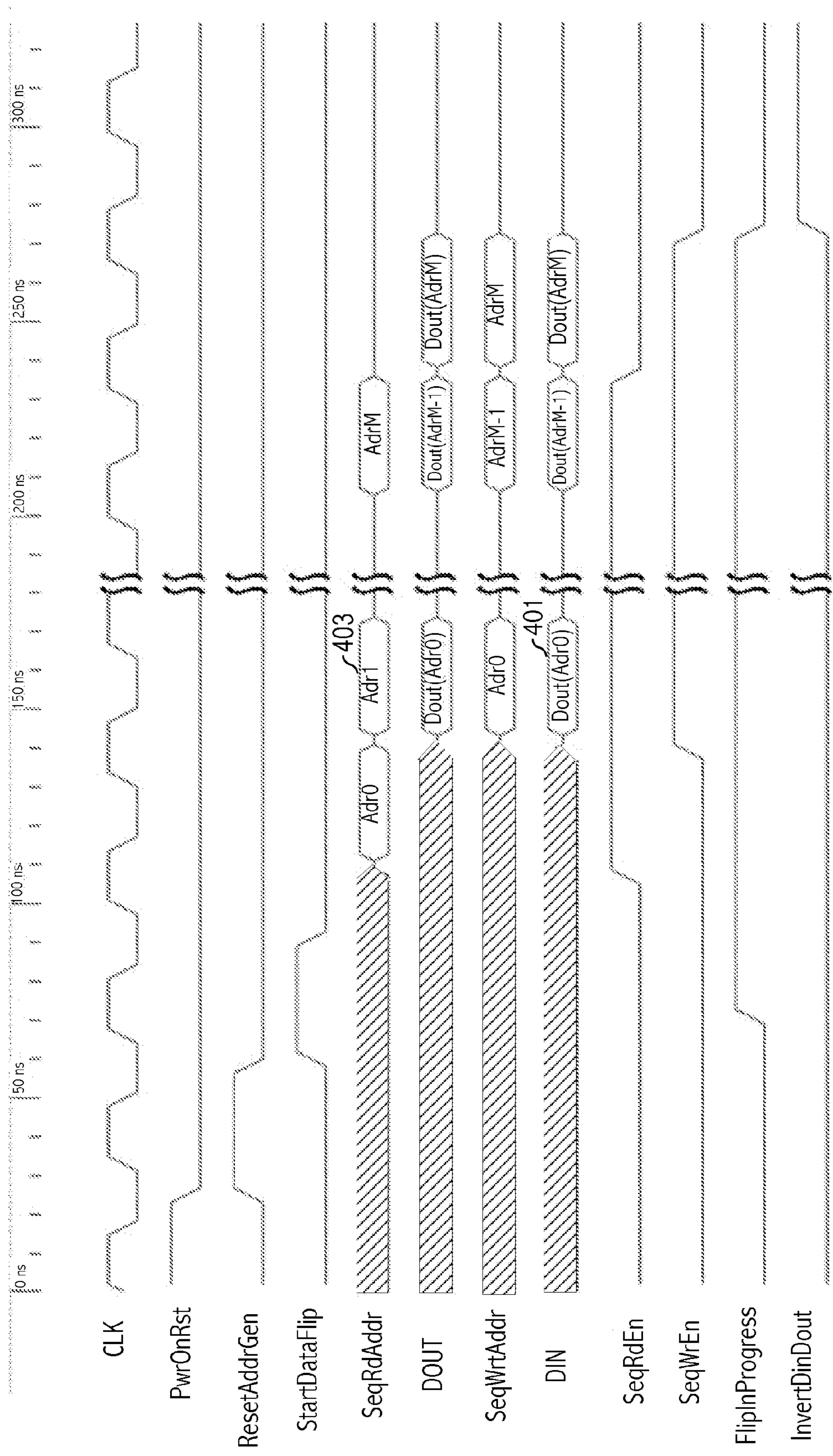
FIG. 4 illustrates a timing diagram associated with a pipelined embodiment.

FIG. 4 illustrates an example of a timing diagram that may be associated with the operation of the flip logic described in association with FIGS. 2 and 3. After the power-on-reset signal supplied goes low at 401, 'InvertDinDout' signal (that is generated by the DCSAG block) is going to go low, so write/read operations into the memory block can begin in the regular non-flipped mode. In an embodiment, each time it becomes known that the memory block will not be accessed for long periods of time, the signal ResetAddrGen is asserted for at-least 1 clock cycle. That access knowledge may be based, e.g., on the system about to enter a low power state such as a sleep state and thus the memory will be inactive for a sufficiently long period to perform the data flipping operation. Asserting ResetAddrGen resets the address generators 210 and 212. After lowering the 'ResetAddrGen' signal, the 'StartDataFlip' signal is taken high for at least 1 clock cycle. That initiates the data-flipping of the memories. The FlipInProgress signal 207 is asserted indicating that the process of flipping data of the memories is active. The FlipInProgress signal 207 remains asserted until the entire data-flipping operation of the memory is complete. The write address 401 is delayed from the read address 403 as shown in FIG. 4. The data DOUT is available as DIN as shown with only a multiplexer and inverter delay. Once completed, the InvertDinDout signal toggles state (i.e., if it was 0 before, it will go to 1 and vice-versa). InvertDinDout signal 209 indicates whether the data in the memory is flipped and therefore data written to and read from the memory 200 requires inverting. The FlipInProgress signal 207 also goes low after the data-flipping operation is complete as shown.

There are several possibilities on how the additional piece of logic for data flipping can be physically partitioned, especially when used with compiled memories. In one approach, all the additional logic shown in the diagram can be part of the compiled memory. In another approach, the DCSAG block may be synthesized and utilized with a compiled memory. The additional logic required to implement the bit-flip functionality as described is quite small and can easily fit into the control logic of already implemented compiled memory blocks. Although, adding the multiplexers on the address/data/enable signals of the memory affects the timing slightly (if these are critical paths in the design), the advantages of BTI mitigation where lower voltages can be used, more than offsets the lost time due to additional gates.

While circuits and physical structures have been generally presumed in describing embodiments, it is well recognized that in modern semiconductor design and fabrication, physical structures and circuits may be embodied in a computer readable medium as data structures for use in subsequent design, simulation, test, or fabrication stages. For example, such data structures may encode a functional description of circuits or systems of circuits. The functionally descriptive data structures may be, e.g., encoded in a register transfer language (RTL), a hardware description language (HDL), in Verilog, or some other language used for design, simulation, and/or test. Data structures corresponding to embodiments described herein may also be encoded in, e.g., Graphic Database System II (GDSII) data, and functionally describe integrated circuit layout and/or information for photomask generation used to manufacture the integrated circuits. Other data structures, containing functionally descriptive aspects of embodiments described herein, may be used for one or more steps of the manufacturing process.

Computer-readable media include tangible computer readable media, e.g., a disk, tape, or other magnetic, optical, or electronic storage medium. In addition to computer-readable medium having encodings thereon of circuits, systems, and methods, the computer readable media may store instructions as well as data that can be used to implement embodiments described herein or portions thereof. The data structures may be utilized by software executing on one or more processors, firmware executing on hardware, or by a combination of software, firmware, and hardware, as part of the design, simulation, test, or fabrication stages.

The description of the embodiments set forth herein is illustrative, and is not intended to limit the scope of the following claims. For example, embodiments described herein apply to SRAMs generally, not just to specific embedded SRAM applications. Other variations and modifications of the embodiments disclosed herein may be made based on the description set forth herein, without departing from the scope of the following claims.

What is claimed is:

1. An apparatus comprising:

a memory;

a first selector circuit to select between inverted read data and non-inverted read data;

a second selector circuit to select between non-inverted write data, inverted write data, and the inverted read data, and supply the selected data to the memory, wherein the second selector circuit comprises a first multiplexer circuit coupled to receive the inverted write data and the write data and a second multiplexer circuit coupled to receive an output of the first multiplexer circuit and the inverted read data; and control logic to generate a flip-in-progress indication that when asserted, causes the first selector circuit to select the inverted read data and when asserted causes the second multiplexer circuit to select the inverted read data.

2. The apparatus as recited in claim 1 further comprising a first inverter circuit coupled to receive read data from the memory and supply the first and second selector circuits with the inverted read data.

3. The apparatus as recited in claim 2 further comprising a second inverter circuit coupled to receive the write data and supply the inverted write data to the second selector circuit.

4. The apparatus as recited in claim 1 further comprising a third selector circuit to select between a functional read address and a sequential read address and to supply the memory with the selected read address.

5. The apparatus as recited in claim 1 further comprising a fourth selector circuit to select between a functional write address and a sequential write address and to supply the memory with the selected write address.

6. The integrated circuit as recited in claim 1 further comprising a read address generator to generate sequential read addresses.

7. The integrated circuit as recited in claim 6 further comprising a write address generator coupled to receive the sequential read addresses and provide sequential write addresses that are delayed sequential read addresses.

8. The integrated circuit as recited in claim 1 wherein the control logic further generates an invert data-in and data-out indication that causes the first selector circuit to select the inverted read data and the first multiplexer to select the inverted write data to thereby flip write and read data of the memory.

9. The integrated circuit as recited in claim 1 wherein the memory is static random access memory.

10. A method comprising:

selecting in a first selector circuit between inverted read data and non-inverted read data, the read data from a memory;

selecting in a second selector circuit between non-inverted write data, inverted write data, and the inverted read data, and writing the selected data to the memory;

generating in control logic a flip-in-progress indication;

selecting in the first selector circuit the inverted read data responsive to the flip-in-progress indication being asserted and selecting in the second selector circuit the inverted read data responsive to the flip-in-progress indication being asserted;

generating in the control logic an invert data-in and data-out indication indicating whether data in the memory is flipped and selecting in the first selector circuit the inverted read data responsive to the invert data-in and data-out indication being asserted;

selecting in the second selector circuit the inverted write data responsive to the flip-in-progress indication not being asserted and the invert data-in and data-out indication being asserted and selecting in the second selector circuit the non-inverted write data responsive to the invert data-in and data-out indication not being asserted and the flip-in-progress indication not being asserted.

11. The method as recited in claim 10 further comprising:

generating sequential read addresses for reading out data from the memory; and generating write addresses for writing the inverted read out data by delaying the read addresses.

12. The method as recited in claim 10 wherein the selecting in the second selector circuit further comprises:

selecting at a first multiplexer circuit of the second selector circuit between the inverted write data and the write data and selecting at a second multiplexer circuit of the second selector circuit between an output of the first multiplexer circuit and the inverted read data.

13. The method as recited in claim 12 further comprising:

inverting functional data and supplying the inverted functional data to the first multiplexer circuit.

14. The method as recited in claim 10 further comprising reflipping locations in the memory by:

reading out inverted data from the memory;

inverting the read out inverted data; and writing the inverted read out inverted data into the memory locations until the predetermined number of memory locations have been read out and written.

15. The method as recited in claim 14 further comprising:

after completing the reflipping, setting the invert data-in and data-out indication to indicate that data in the memory is not flipped.

16. The method as recited in claim 10 further comprising flipping data in the memory in response to an indication that the memory is not going to be used for a period of time.

17. The method as recited in claim 10 further comprising flipping data in the memory during a period of functional inactivity.

18. A non-transitory computer-readable medium storing a computer readable data structure encoding a functional description of an integrated circuit, the integrated circuit comprising:

a static random access memory;

a first selector circuit to select between inverted read data and non-inverted read data;

a second selector circuit to select between non-inverted write data, inverted write data, and the inverted read data, and supply the selected data to the memory, wherein the second selector circuit comprises a first multiplexer circuit coupled to receive the inverted write data and the non-inverted write data and a second multiplexer circuit coupled to receive an output of the first multiplexer circuit and the inverted read data;

a first inverter circuit coupled to receive read data from the memory and supply the first and second selector circuits with the inverted read data;

a second inverter circuit coupled to receive the write data and supply inverted write data to the second selector circuit; and control logic to generate a flip-in-progress indication that when asserted, causes the first selector circuit to select the inverted read data and when asserted causes the second multiplexer circuit to select the inverted read data, wherein the control logic further generates an invert data-in and data-out indication that causes the first selector circuit to select the inverted read data and the first multiplexer to select the inverted write data to thereby flip write and read data of the memory.

* * * * *